United States Patent
Kanki et al.

(10) Patent No.: US 9,263,326 B2
(45) Date of Patent: Feb. 16, 2016

(54) INTERCONNECTION STRUCTURE AND METHOD OF FORMING THE SAME

(71) Applicant: FUJITSU LIMITED, Kawasaki-shi, Kanagawa (JP)

(72) Inventors: Tsuyoshi Kanki, Kawasaki (JP); Yoshihiro Nakata, Kawasaki (JP); Yasushi Kobayashi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/706,764

(22) Filed: May 7, 2015

(65) Prior Publication Data
US 2015/0243555 A1 Aug. 27, 2015

Related U.S. Application Data

(60) Division of application No. 13/431,127, filed on Mar. 27, 2012, now abandoned, which is a continuation of application No. PCT/JP2009/071777, filed on Dec. 28, 2009.

(51) Int. Cl.
*H01L 21/44* (2006.01)
*H01L 21/768* (2006.01)
(Continued)

(52) U.S. Cl.
CPC .... *H01L 21/76877* (2013.01); *H01L 21/02068* (2013.01); *H01L 21/02071* (2013.01); *H01L 21/02074* (2013.01); *H01L 21/288* (2013.01);
(Continued)

(58) Field of Classification Search
CPC ....................................................... H01L 21/00
USPC ........... 257/E21.174, E23.161; 438/687, 678, 438/692
See application file for complete search history.

(56) References Cited

U.S. PATENT DOCUMENTS

| 6,528,409 B1 | 3/2003 | Lopatin et al. |
| 7,413,983 B2 | 8/2008 | Inoue et al. |

(Continued)

FOREIGN PATENT DOCUMENTS

| JP | 2003124591 A | 4/2003 |
| JP | 2004014975 A | 1/2004 |

(Continued)

OTHER PUBLICATIONS

International Search Report of PCT/JP2009/071777, mailing date Mar. 9, 2010.

(Continued)

*Primary Examiner* — Telly Green
(74) *Attorney, Agent, or Firm* — Westerman, Hattori, Daniels & Adrian, LLP

(57) ABSTRACT

After a copper interconnection is formed above a substrate, a surface of the copper interconnection is activated by performing acid cleaning. Thereafter, the substrate is immersed in a BTA (Benzo triazole) aqueous solution to form a protection film covering the surface of the copper interconnection. At this time, Cu—N—R bonds (R is an organic group) are formed in grain boundary portions in the surface of the copper interconnection. Thereafter, the protection film is removed by performing alkaline cleaning. The Cu—N—R bonds remain in the grain boundary portions in the surface of the copper interconnection even after the protection film is removed. Subsequently, the surface of the copper interconnection is subjected to an activation process, and a barrier layer is formed thereafter by electroless-plating the surface of the copper interconnection with NiP or CoWP.

9 Claims, 18 Drawing Sheets

(51) Int. Cl.
    *H01L 21/02*     (2006.01)
    *H01L 21/288*     (2006.01)
    *H01L 21/321*     (2006.01)
    *H01L 23/532*     (2006.01)
    *H05K 3/24*     (2006.01)

(52) U.S. Cl.
    CPC ........ *H01L 21/321* (2013.01); *H01L 21/76834* (2013.01); *H01L 21/76841* (2013.01); *H01L 21/76852* (2013.01); *H01L 21/76885* (2013.01); *H01L 23/53238* (2013.01); *H01L 2924/0002* (2013.01); *H05K 3/24* (2013.01)

(56) References Cited

U.S. PATENT DOCUMENTS

| | | |
|---|---|---|
| 2003/0116439 A1 | 6/2003 | Seo et al. |
| 2003/0205825 A1 | 11/2003 | Fujisawa et al. |
| 2004/0185683 A1 | 9/2004 | Nakamura |
| 2005/0062169 A1 | 3/2005 | Dubin et al. |
| 2005/0069646 A1 | 3/2005 | Inoue et al. |
| 2005/0106764 A1 | 5/2005 | Kim |
| 2005/0124154 A1 | 6/2005 | Park et al. |
| 2006/0022320 A1 | 2/2006 | Nakanishi et al. |
| 2006/0286816 A1 | 12/2006 | Aoi et al. |
| 2008/0047739 A1 | 2/2008 | Ishii et al. |
| 2008/0160750 A1 | 7/2008 | Takewaki et al. |
| 2008/0246151 A1 | 10/2008 | Yang et al. |
| 2009/0042403 A1 | 2/2009 | Aoi et al. |
| 2009/0085173 A1 | 4/2009 | Boemmels et al. |
| 2009/0107626 A1 | 4/2009 | Lee et al. |
| 2009/0269923 A1 | 10/2009 | Lee et al. |
| 2009/0277867 A1 | 11/2009 | Mayer et al. |
| 2010/0044085 A1 | 2/2010 | Nakamura |
| 2012/0276301 A1 | 11/2012 | Lee et al. |

FOREIGN PATENT DOCUMENTS

| | | |
|---|---|---|
| JP | 2004082444 A | 3/2004 |
| JP | 2004304167 A | 10/2004 |
| JP | 2005002443 A | 1/2005 |
| JP | 2008034639 A | 2/2008 |
| JP | 2008166751 A | 7/2008 |
| JP | 2009290240 A | 12/2009 |
| KR | 10-2004-0001991 A | 1/2004 |
| KR | 10-2006-0048884 A | 5/2006 |

OTHER PUBLICATIONS

Korean Office Action dated Mar. 28, 2013, issued in corresponding Korean Patent Application No. 10-2012-7009191, with English translation (9 pages).

Extended European Search Report dated Jul. 4, 2014, issued in corresponding European Patent Application No. 09852805.2 (7 pages).

INTERCONNECTION STRUCTURE AND METHOD OF FORMING THE SAME

CROSS-REFERENCE TO RELATED APPLICATION

This application is a divisional of U.S. application Ser. No. 13/431,127 filed Mar. 27, 2012 which is a continuation of the prior International Patent Application No. PCT/JP2009/071777 filed Dec. 28, 2009, the entire contents of which are incorporated herein by reference.

FIELD

The embodiments discussed herein relate to an interconnection structure having a copper interconnection and to a method of forming the same.

BACKGROUND

There is a demand to further reduce the size and improve the performance of a semiconductor device to be mounted on an electronic apparatus. Along with the reduction in size and improvement in performance of the semiconductor device, many connection terminals have been arranged at a narrow pitch on a lower face or a side face of the semiconductor device, and there has been a demand to achieve more multi-layered and finer (smaller in width) interconnections of a circuit board on which the semiconductor device is to be mounted.

There are various forms of circuit boards on which the semiconductor device is mounted, such as a package board and a silicon interposer. Generally, copper (Cu) or a copper alloy (hereafter, when used alone, the term "copper" is meant to encompass copper alloys) is used as an interconnection material of the circuit boards, since copper and copper alloys have low electrical resistances. Moreover, a subtractive method and a semi-additive method are known as methods of forming copper interconnections in these circuit boards. It is said that the semi-addictive method is better suited than the subtractive method for forming the copper interconnections at a narrow pitch of the package board, the silicon interposer, and the like.

Patent Document 1: Japanese Laid-open Patent Publication No. 2004-304167

Patent Document 2: Japanese Laid-open Patent Publication No. 2004-14975

Patent Document 3: Japanese Laid-open Patent Publication No. 2008-34639

Patent Document 4: Japanese Laid-open Patent Publication No. 2003-124591

When copper is used as the interconnection material, Cu atoms sometimes diffuse into an insulating film covering the interconnections. Thus, a leakage between the interconnections becomes a problem along with the finer designing of interconnection. Moreover, there is a problem that the surfaces of copper interconnections are oxidized by moisture and oxygen contained in the insulating film thereby causing an increase in interconnection resistance. Furthermore, the finer designing of the interconnections causes a phenomenon in which metal atoms move along with the electric conduction and the width of each interconnection becomes even smaller, i.e. electromigration. Hence, the reliability in a long-term use is reduced. Although the copper interconnections have a higher electromigration resistance than aluminum interconnections, the electromigration may not be ignored when the width of the copper interconnections is, for example, 2 μm or less.

SUMMARY

One aspect provides an interconnection structure including: a substrate; a copper interconnection formed above the substrate; an insulating layer covering the copper interconnection; and a barrier layer formed between the copper interconnection and the insulating layer, the interconnection structure having a Cu—N—R bond (provided that R is an organic group) in a portion of a grain boundary in a surface of the copper interconnection.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A prelude to facilitate understandings of embodiments is described below before the embodiments are described.

FIGS. 1A to 1G are views depicting an example of a method forming a copper interconnection by a semi-additive method.

Figure 1A:
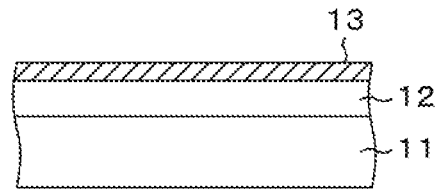
FIGS. 1A to 1G are views depicting an example of a method of forming a copper interconnection by a semi-additive method.

First, as depicted in FIG. 1A, an underlying insulating film 12 is formed on a silicon (Si) substrate 11, and an adhesion layer 13 is then formed of, for example, Ti on the resultant product. The adhesion layer 13 has a function of causing the underlying insulating film 12 and a copper interconnection to be formed on the adhesion layer 13 in steps described later to firmly adhere to each other and a function as a barrier layer which prevents metal atoms (Cu) from diffusing into the underlying insulating film 12 from the copper interconnection.

Figure 1B:
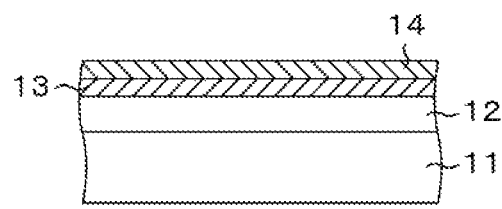
Figure 1C:
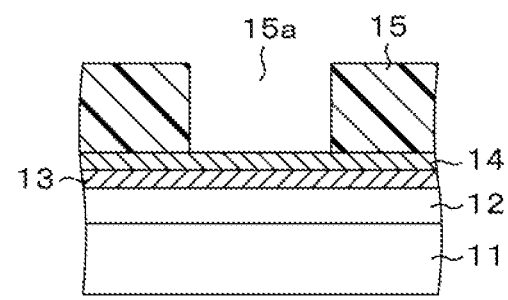

Next, as depicted in FIG. 1B, a plating seed layer 14 is thinly formed on the adhesion layer 13. Thereafter, as depicted in FIG. 1C, a photoresist film 15 is formed on the plating seed layer 14, exposure and development processes are performed, and an opening portion 15a through which the plating seed layer 14 is exposed is thereby formed with a desired pattern.

Figure 1D:
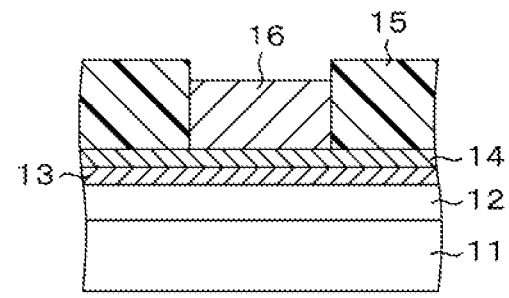

Next, as depicted in FIG. 1D, copper is plated on the plating seed layer 14 inside the opening portion 15a by an electroplating method or an electroless-plating method, and a copper interconnection 16 is thus formed.

Figure 1E:
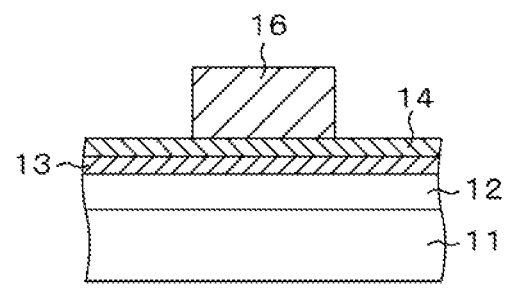
Figure 1F:
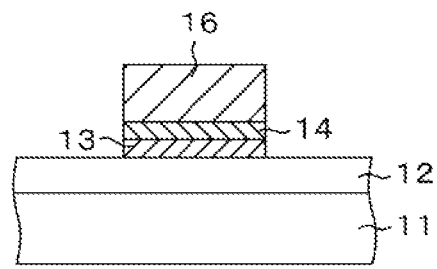
Figure 1G:
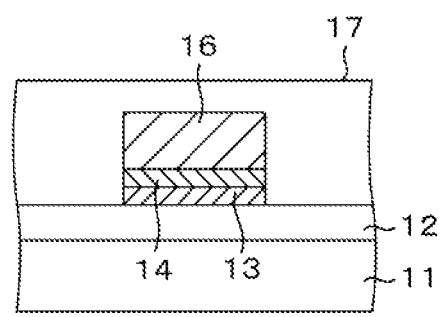

Next, as depicted in FIG. 1E, the photoresist film 15 is removed. Then, as depicted in FIG. 1F, portions of the plating seed layer 14 and the adhesion layer 13 which are not covered with the copper interconnection 16 is removed by etching. Thereafter, as depicted in FIG. 1G, an insulating material is deposited on an entire upper face of the substrate 11 to form an insulating film 17 covering the copper interconnection 16. An interconnection structure is thus formed.

In the interconnection structure formed as described above, side faces and the upper face of the copper interconnection 16 are in direct contact with the insulating film 17. Hence, the side faces and upper face of the copper interconnection 16 are oxidized by moisture or oxygen contained in the insulating film 17. Moreover, it is confirmed in a high-temperature accelerated test (reliability test) testing a long-term reliability under a high-temperature environment that metal atoms (Cu) diffuse into the insulating film 17 from the copper interconnection 16.

In order to avoid the oxidation of copper interconnection or the diffusion of metal atoms, it is conceivable to provide a barrier layer to cover the side faces and upper face of the copper interconnection. For example, a plating layer made of a metal such as NiP is formed as the barrier layer to cover the side faces and upper face of the copper interconnection, and the oxidation of copper interconnection and the diffusion of metal atoms may be thereby avoided.

However, when this method is applied to a copper interconnection having a width of 2 μm or smaller, although the oxidation of copper interconnection or the diffusion of Cu into the insulating film may be prevented, it may be impossible to prevent a phenomenon in which the width of the interconnection becomes smaller along with electric conduction, i.e. electromigration. The electromigration relates to voids (air gaps) occurring in the interconnection and it may be said that the more likely the voids are to occur, the lower the electromigration resistance is.

When the barrier layer is formed around the copper interconnection as described above, the voids mainly occur in grain boundary portions (including grain boundary triple point portions: the same hereafter) in a surface of the copper interconnection. The reason why the voids occur in the grain boundary portions may be conceived as follows.

Specifically, a large amount of copper oxide in which copper (Cu) and oxygen (O) bond together exists in the grain boundary portions in the surface of copper interconnection. When the high-temperature accelerated test is performed or an electric current flows through the copper interconnection, the copper oxide turn into copper ions and tend to move. Portions from which the copper ions have moved away become cores in the occurrence of voids. Small vacancies originally exist in the copper interconnection or in a boundary between the copper interconnection and the plating layer. These vacancies gather to portions where the copper ions have moved away in grain boundary portions in the surface of copper interconnection due to the high-temperature accelerated test or electrical conduction, thereby forming voids.

The inventors of the present application conduct various experiments and researches to avoid the occurrence of voids. As a result, the inventors find out that the occurrence of voids may be reduced by forming a compound having Cu—N—R bonds in the grain boundary portions. Here, R refers to an organic group. For example, BTA (Benzo triazole) prevents ionization of copper in such a way that N substitutes O and bonds with Cu in the grain boundary portions in the surface of copper interconnection. Easily-moveable copper ions no longer exist as a result of this bonding and the vacancies are thereby less likely to gather in the grain boundary portions. As a result, the occurrence of voids is avoided and the electromigration resistance is improved. The embodiments are described below.

1. First Embodiment

FIGS. 2A to 2J are cross sectional views depicting a method of forming an interconnection structure according to a first embodiment in the order of steps.

Figure 2A:
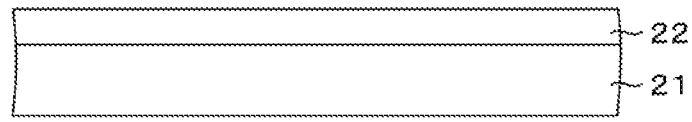
FIGS. 2A to 2J are cross-sectional views depicting a method of forming an interconnection structure according to a first embodiment.

First, as depicted in FIG. 2A, an underlying insulating film 22 is formed on a substrate 21. Although a silicon substrate is used as the substrate 21 in the embodiment, a substrate made of a resin, a ceramic, or the like may be also used. The underlying insulating film 22 may be a thermal oxidation film formed by subjecting a surface of the silicon substrate 21 to thermal oxidation or an insulating film formed by a CVD (Chemical Vapor Deposition) method or the like.

Figure 2B:
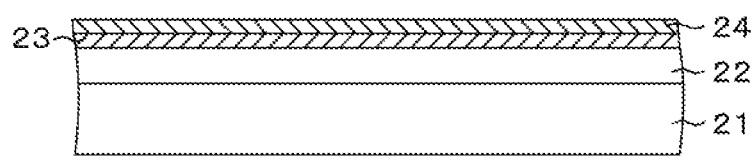

Next, as depicted in FIG. 2B, an adhesion layer 23 made of a metal such as Ti (titanium) or a compound thereof is formed with a thickness of about, for example, 5 nm to 20 nm on the underlying insulating film 22. The adhesion layer 23 has a function of causing the underlying insulating film 22 and copper interconnections 26 (see FIG. 2D) to be described later to firmly adhere to each other and a function as a barrier layer which prevents metal atoms (Cu) from diffusing into the underlying insulating film 22 from the copper interconnections 26. After the adhesion layer 23 is formed, a plating seed layer 24 made of copper is formed with a thickness of 10 nm to 200 nm on the adhesion layer 23 by, for example, a sputtering method.

Figure 2C:
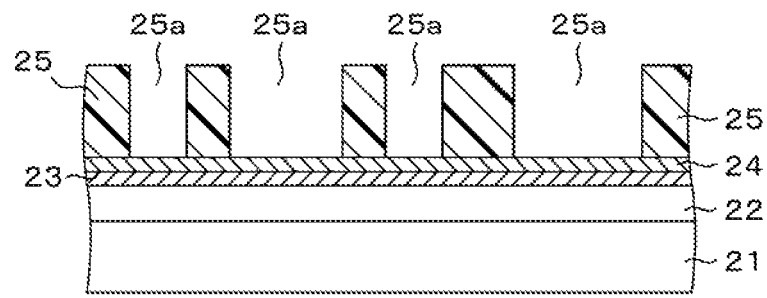

Next, as depicted in FIG. 2C, a photoresist film 25 is formed on the plating seed layer 24, the photoresist film 25 is exposed and developed, and opening portions 25a through which the plating seed layer 24 is exposed are thereby formed with a desired pattern (interconnection pattern). Here, the width of each opening portion 25a, i.e. the width of each of interconnections to be formed is assumed to be about 2 μm.

Figure 2D:
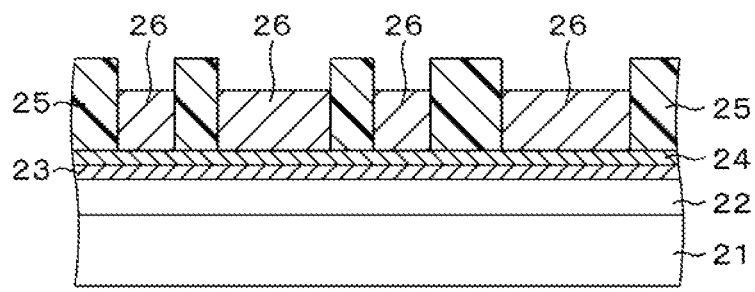
Figure 2E:
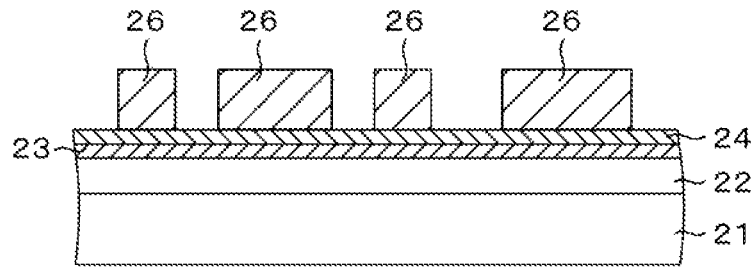

Next, as depicted in FIG. 2D, copper is plated with a thickness of, for example, 2 μm on the seed layer 24 inside the opening portions 25a by electroplating or electroless-plating, and the copper interconnections 26 are thereby obtained. Thereafter, as depicted in FIG. 2E, the photoresist film 25 is removed.

Figure 2F:
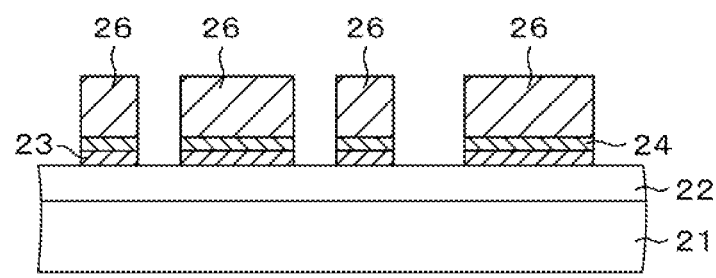

Next, as depicted in FIG. 2F, portions of the seed layer 24 and the adhesion layer 23 which are not covered with the copper interconnections 26 are removed by etching. The plating seed layer 24 is etched by using, for example, potassium sulfide. In the etching step, the copper interconnections 26 are also etched. However, since the copper interconnections 26 are sufficiently thicker than the seed layer 24 and the adhesion layer 23, a decrease in thickness of the copper interconnections 26 is slight. The width of each opening portion 25a and the plating thickness in the formation of the copper interconnections 26 are set in consideration of the decrease in the film thickness due to etching. The adhesion layer 23 is etched by using, for example, ammonium fluoride.

Figure 2G:
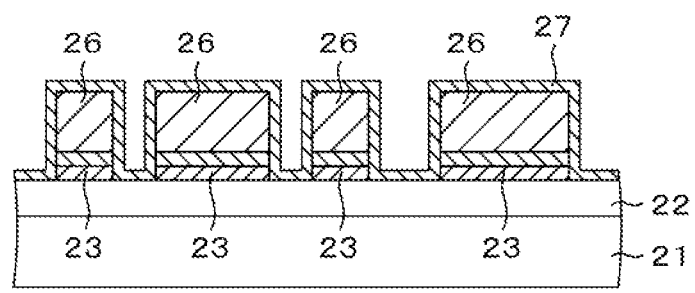

Next, the surfaces (upper faces and side faces) of the copper interconnections 26 are acid-cleaned by using $H_2SO_4$ (sulfuric acid) aqueous solution or the like. The acid-cleaning causes the surfaces of the copper interconnections 26 to be active. Thereafter, the substrate 21 having the copper interconnections 26 is immersed in an aqueous solution containing an imidazole-based organic compound such as BTA. As depicted in FIG. 2G, this causes a protection film 27 covering the side faces and upper faces of the copper interconnections 26 to be formed. The protection film 27 has Cu—N—R bonds in grain boundary portions in the surfaces of the copper interconnections 26.

Figure 2H:
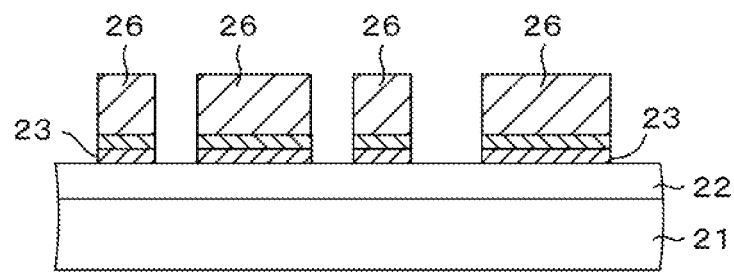

Next, the substrate 21 having the protection film 27 formed thereon is cleaned by using an alkaline cleaning solution (for example, KOH aqueous solution) whose pH is adjusted to be within a range of 8.0 to 10.0, and the protection film 27 is thereby removed as depicted in FIG. 2H. After the protection film 27 is removed, the Cu—N—R bonds remain in the grain boundary portions in the surfaces of the copper interconnections 26.

Thereafter, the substrate 21 is immersed in an activation process solution containing Pd (palladium) (for example, an acid solution containing palladium chloride as a main component). This causes the surfaces of the copper interconnections 26 to be activated.

Figure 2I:
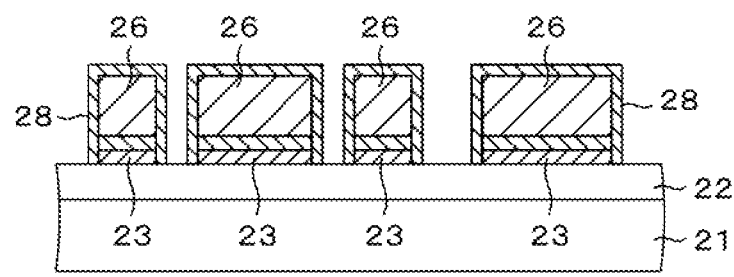

Next, a metal such as CoWP or NiP is deposited onto the side faces and upper faces of the copper interconnections 26 by an electroless plating method and a barrier layer 28 is thereby formed as depicted in FIG. 2I. The thickness of the barrier layer 28 is, for example, 20 nm to 200 nm. The barrier layer 28 is formed of such a metal that has an excellent adhesion to the copper interconnection 26 and is capable of preventing diffusion of Cu and entrance of moisture or oxygen. Metals preferable for the barrier layer 28 include CoWB, CoP, CoB, NiWP, NiB, NiWB, and the like, in addition to CoWP and NiP described above.

Figure 2J:
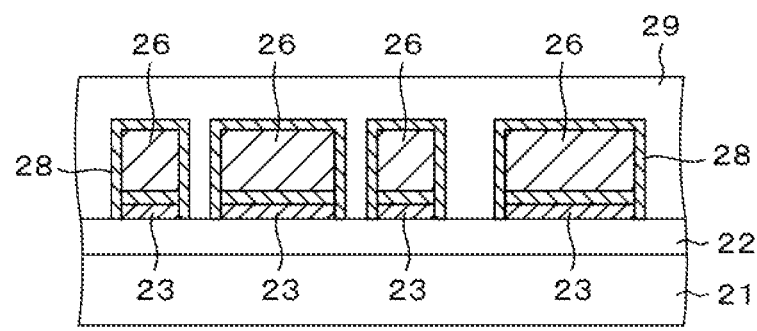

Next, as depicted in FIG. 2J, an insulating film 29 is formed with a thickness of, for example, 5 μm on the entire upper face of the substrate 21 and the copper interconnections 26 are thereby covered with the insulating film 29. The insulating film 29 may be formed of an organic insulating material such as a resin or may be formed of an inorganic insulating material such as silicon oxide. The interconnection structure of the embodiment is thus completed.

Figure 3:
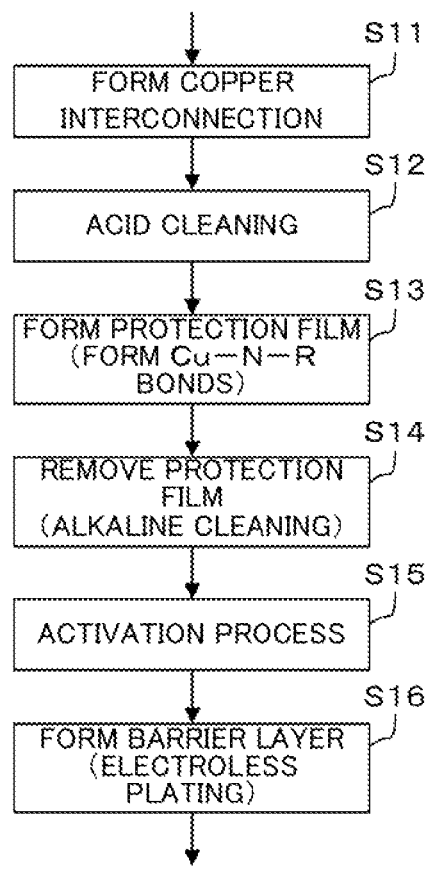
FIG. 3 is a diaphragm illustrating a flow from formation of copper interconnections to formation of a barrier layer.

FIG. 3 is a diagram illustrating a flow from the formation of the copper interconnection to the formation of the barrier layer. Moreover, FIGS. 4A to 4C are views schematically depicting states from the step of forming the protection film 27 to the step of forming the barrier layer 28.

In the embodiment, after the copper interconnections 26 are formed (step S11), the surfaces of the copper interconnections are activated by performing acid cleaning (step S12). Then, the substrate 21 is immersed in the BTA aqueous solution to form the protection film 27 and to also form the Cu—N—R bonds in the grain boundary portions in the surfaces of the copper interconnections 26 (step S13).

Figure 4A:
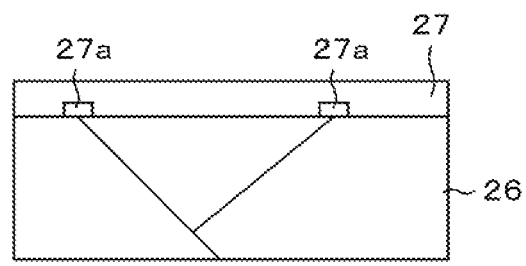
FIGS. 4A to 4C are views schematically depicting states from a step of forming a protection film to a step of forming the barrier layer.
Figure 4B:
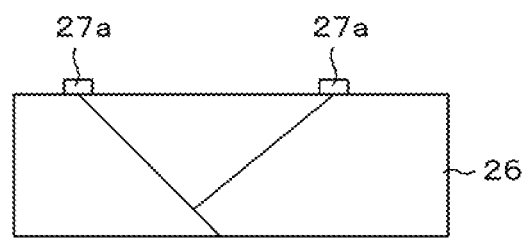
Figure 4C:
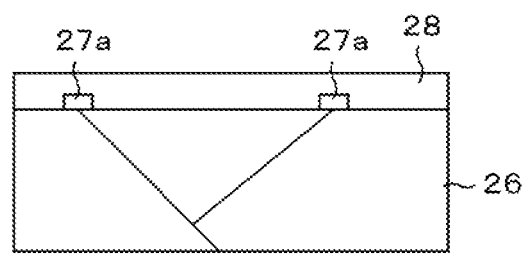

FIG. 4A schematically depicts a state where the substrate 21 having the copper interconnection 26 formed thereon is immersed in the BTA aqueous solution and the protection film 27 is thereby formed on the surface of the copper interconnection 26. Many grain boundaries are included in the copper interconnection 26. As described above, the protection film 27 has Cu—N—R bonds 27a in the grain boundary portions in the surface of the copper interconnection 26. When the alkaline cleaning (step S14) is performed in this state, as depicted in FIG. 4B, the protection film 27 is removed but the Cu—N—R bonds 27a in the grain boundary portions in the surfaces of the copper interconnections 26 remain. Thereafter, the surfaces of the copper interconnections 26 are subjected to the activation process (step S15) by using the activation process solution containing Pd, and then the barrier layer 28 covering the surface of the copper interconnection 26 is formed as depicted in FIG. 4C (step S16).

Note that oxygen (O) bonding with copper (Cu) exists in portions other than the grain boundaries in the surfaces of the copper interconnections 26 in actual, and Cu—N—R bonds are formed in the portions other than the grain boundaries when the protection film 27 is formed. However, the number of Cu—N—R bonds is small and most of the Cu—N—R bonds existing in the portions other than the grain boundaries are removed when the protection film 27 is removed by alkaline cleaning.

In the state where the copper interconnections 26 are completely covered with the protection film 27 as depicted in FIG. 4A, even when the substrate 21 having the copper interconnections 26 formed thereon is immersed in the activation process solution, the protection film 27 hinders the activation process and the formation of the barrier layer 28 is made difficult. Moreover, even if the barrier layer 28 is formed on the protection film 27, the adhesion of the barrier layer 28 is not secured due to the existence of the protection film 27. Accordingly, the step of removing the protection film 27 may be required to form the barrier layer 28 with an excellent adhesion.

In the embodiment, occurrence of voids is prevented by forming the Cu—N—R bonds 27a in the grain boundary portions in the surfaces of the copper interconnections 26. Moreover, as depicted in FIGS. 4B and 4C, the adhesion between the copper interconnections 26 and the barrier layer 28 is secured by removing the protection film 27 and by subjecting the surfaces of the copper interconnections 26 to the activation process.

Figure 5A:
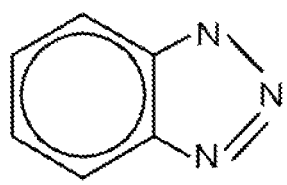
FIGS. 5A and 5B are schematic views depicting a formation process of Cu—N—R bonds.
Figure 5B:
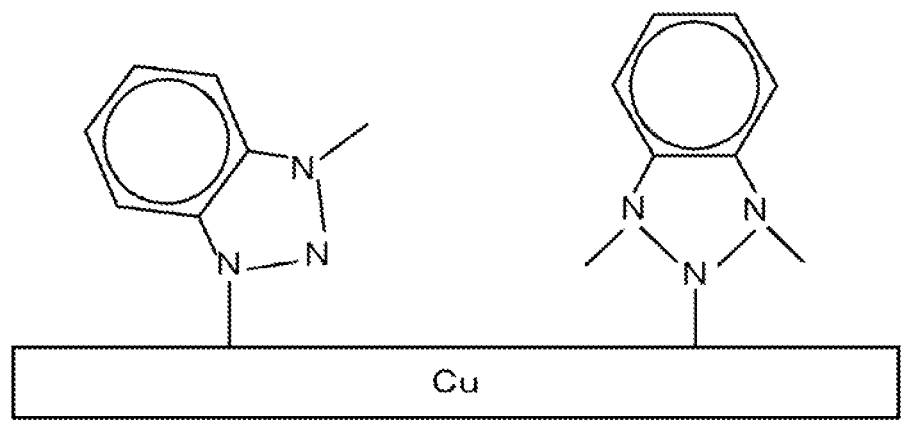

FIGS. 5A and 5B are schematic views depicting the formation process of Cu—N—R bonds. As depicted in FIG. 5A, BTA has a double bond of nitrogen (N). When the substrate 21 having the copper interconnections 26 formed thereon is immersed into the BTA aqueous solution, it is conceived that the double bond portion of BTA is disrupted as depicted in FIG. 5B, N substitutes O, and BTA and Cu bond to each other. An imidazole-based organic compound or an organic compound having a benzene ring and an N—H bond is conceivable as a substance capable of having such a structure. Moreover, a chelating agent which chelates Cu is conceived to have a similar effect.

Incidentally, a case is conceivable where BTA bonding to Cu in the grain boundary portions are removed in the removable of the protection film 27. If BTA exists on the surface of the copper interconnection after the alkaline cleaning, an excellent corrosion resistance may be exhibited. Therefore, whether BTA exists on the surface of the copper interconnection after the alkaline cleaning may be found out by measuring a corrosion current.

Figure 6:
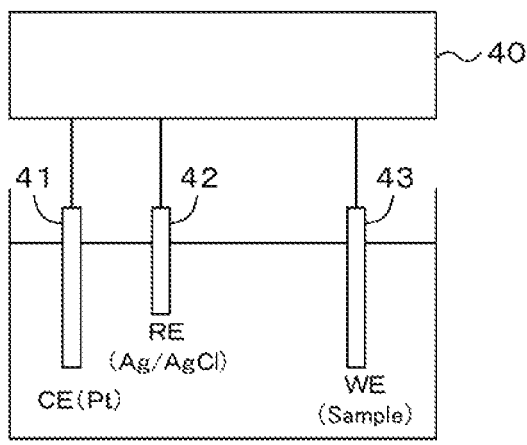
FIG. 6 is a schematic view depicting a corrosion current measurement method.

FIG. 6 is a schematic view depicting a corrosion current measurement method. As depicted in FIG. 6, an Ag/AgCl (Ag and AgCl) electrode is used as a reference electrode (RE) 42 of a corrosion current measuring instrument (Potentio Galvano Stat) 40, and a Pt electrode is used as a counter electrode (CE) 41. Moreover, a substrate having a Cu film which is made to absorb BTA and then cleaned with an alkaline solution with a pH of 8 to 13 is used as a measurement sample (WE) 43. Furthermore, a citric acid aqueous solution is used as a measurement solution. Then, the corrosion current density is measured while sweeping the potential of the measurement sample 43. In this case, it may be said that the corrosion resistance is excellent if the corrosion current density remains low even when the potential of the measurement sample 43 is increased.

Figure 7:
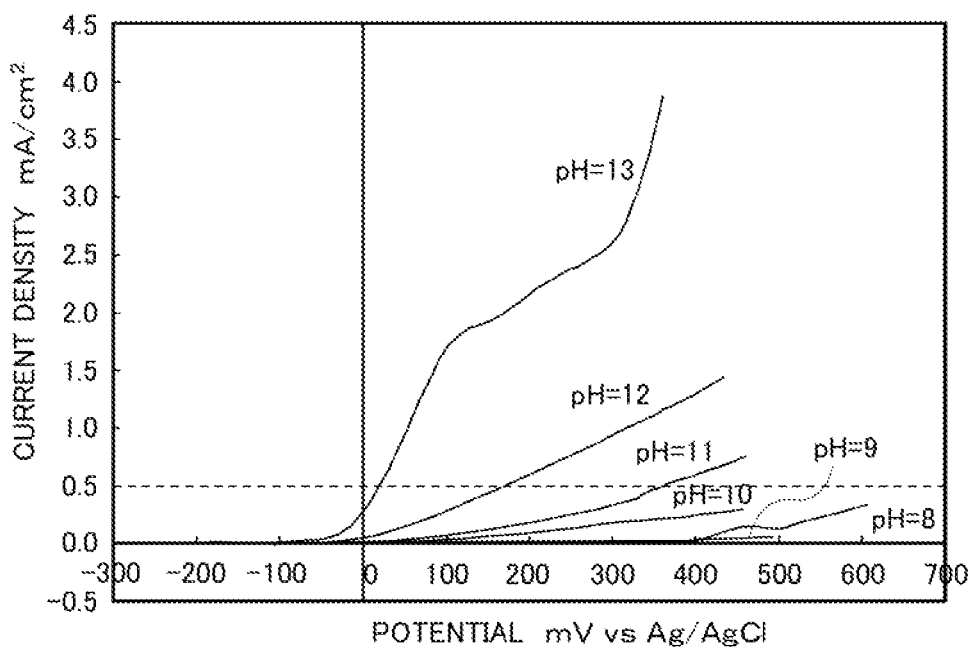
FIG. 7 is a graph indicating a measurement result of corrosion current density.

FIG. 7 is a graph indicating the measurement result of the corrosion current density. It is apparent from FIG. 7 that, when BTA-Cu film is cleaned by using an alkaline solution whose pH is within a range of 8 to 10, the corrosion current density is equal to or below 0.5 mA/cm$^2$ in all of the cases and an excellent corrosion resistance is confirmed. From this result, it is found that BTA exists on the surfaces of the copper interconnections after the alkaline cleaning.

Moreover, it is found from FIG. 7 that the corrosion resistance of a Cu film cleaned by using an alkaline solution whose pH is over 10.0 deteriorates. From this result, it is conceivable that the Cu—N—R bonds in the grain boundary portions are also removed when pH of the alkaline cleaning solution exceeds 10. Thus, the pH of alkaline cleaning solution used to remove the protection film 27 is preferably 10.0 or below. However, when the pH of alkaline cleaning solution is lower than 8.0, the protection film 27 may not be sufficiently removed. Accordingly, the pH of alkaline cleaning solution is preferably within the range of 8.0 to 10.0

Figure 8:
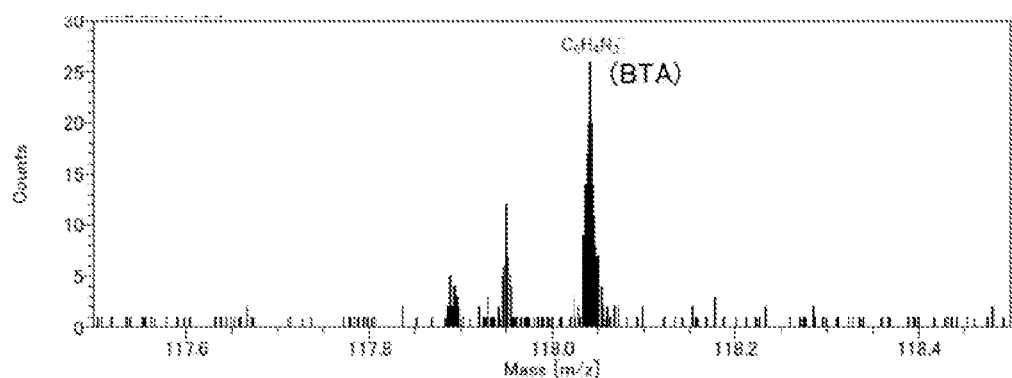
FIG. 8 is a graph indicating a result of mass-analyzing a surface of a copper interconnection by using a TOF-SIMS, the copper interconnection having been subjected to an alkaline cleaning step and steps therebefore.

FIG. 8 is a graph indicating a result of mass-analyzing the surface of the copper interconnection by using a TOF-SIMS (Time-of-Flight secondary ion mass spectrometer), the copper interconnection having been subjected to the alkaline cleaning step and the steps therebefore. It is also found from FIG. 8 that BTA exists on the surfaces of the copper interconnections after the alkaline cleaning.

As described above, the Cu—N—R bonds are formed in the grain boundary portions in the side faces and the upper faces of the copper interconnections 26 in the embodiment. Thus, voids are less likely to occur in the copper interconnections 26. This suppresses electromigration in fine interconnections having a width of, for example, 2 μm or smaller. Moreover, the adhesion layer 23 made of Ti and the barrier layer 28 made of NiP or CoWP are formed around the copper interconnections 26 in the embodiment. Thus, the diffusion of metal atoms (Cu) into the insulating films 22, 29 from the copper interconnections 26 is prevented. Moreover, the oxidation of the copper interconnection 26 caused by moisture and oxygen contained in the insulating films 22, 29 is prevented by the adhesion layer 23 and the barrier layer 28. For these reasons, a disconnection or a current leakage, and an increase in electrical resistance are avoided in the interconnection structure according to the embodiment even when the interconnection structure is used for a long period, and the interconnection structure has a high reliability.

Incidentally, although the formation of Cu—N—R bonds and the cleaning of surfaces of the copper interconnections 26 are performed in different steps in the embodiment described above, these steps may be performed simultaneously. For example, when a BTA aqueous solution whose concentration is 0.5 wt % to 1.0 wt % and whose pH is adjusted to be within a range of 8.0 to 10.0 by using KOH is used, it may be possible to simultaneously perform the formation of Cu—N—R bonds and the cleaning of surfaces of the copper interconnections 26.

Descriptions are given below of a result obtained by actually forming the interconnection structure by the method described above and performing a high-temperature accelerated test.

EXAMPLE 1

First, the surface of the silicon substrate 21 is subjected to thermal oxidation and the underlying insulating film 22 having a thickness of about 100 nm to 1000 nm is thereby formed. Thereafter, Ti is formed with a thickness of 5 nm to 20 nm on the underlying insulating film 22 by the sputtering method as the adhesion layer 23. Then, copper is formed with a thickness of 10 nm to 200 nm on the adhesion layer 23 by the sputtering method as the plating seed layer 24 (see FIG. 2B).

Next, the photoresist film 25 is formed on the plating seed layer 24, the exposure and development processes are performed, and the opening portions 25a are thereby opened with the predetermined pattern in the photoresist film 25. Thereafter, copper is plated on the plating seed layer 24 inside the opening portions 25a by the electroplating method and the copper interconnections 26 each having a thickness of about 2 μm and a width of about 2 μm are formed (see FIG. 2D).

Next, after the removal of the photoresist film 25, the portions of the plating seed layer 24 and the adhesion layer 23 which are not covered with the copper interconnections 26 are removed by etching (see FIG. 2F).

Next, the substrate 21 having the copper interconnections 26 formed thereon is immersed for 5 seconds to 60 seconds in a H$_2$SO$_4$ aqueous solution with a concentration of 10 wt % as an acid activation process. The temperature of the H$_2$SO$_4$ aqueous solution is set at a room temperature.

Thereafter, the substrate 21 is immersed for 60 seconds to 300 seconds in a BTA aqueous solution with a concentration of 0.5 wt % to 1.0 wt % and the protection film 27 covering the upper faces and the side faces of the copper interconnections 26 is thereby formed (see FIG. 2G). The temperature of the BTA aqueous solution is set at the room temperature.

Figure 9:
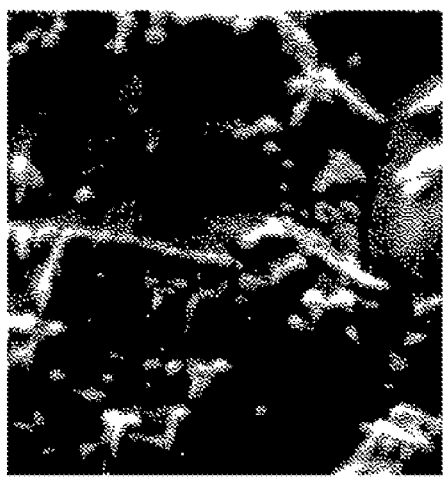
FIG. 9 is a view depicting a binarized micrograph of the surface of copper interconnection after removable of the protection film.

Next, the substrate 21 is immersed in a KOH aqueous solution whose pH is adjusted to be within a range of 8.0 to 10.0 for 60 seconds to 120 seconds and the protection film 27 is thereby removed (see FIG. 2H). The temperature of the KOH aqueous solution is set at the room temperature. FIG. 9 is a view depicting a binarized micrograph of the surface of copper interconnection after the removable of protection film. It is found from FIG. 12 that the Cu—N—R bonds are formed in the grain boundary portions of copper interconnection (white stripe-shaped portions in FIG. 9).

Figure 10:
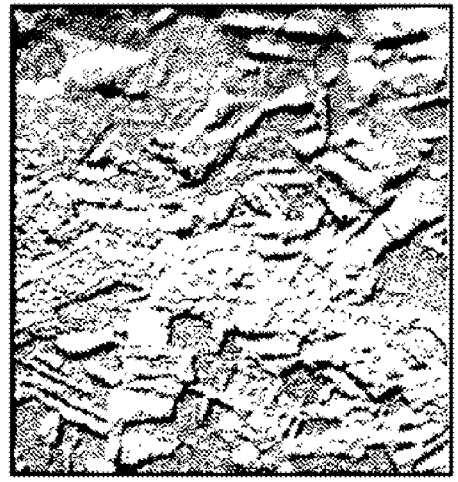
FIG. 10 is a view depicting a binarized micrograph of the surface of copper interconnection after the formation of barrier layer.

Next, the substrate 21 is immersed into an activation process solution containing Pd for 30 seconds to 300 seconds as the activation process. Thereafter, the barrier layer 28 covering the upper faces and the side faces of the copper interconnections 26 is formed (see FIG. 2I). When the barrier layer 28 is to be formed of NiP, the substrate 21 is immersed in a NiP electroless plating solution at the temperature of 70° C. for 60 seconds to 120 seconds. Meanwhile, when the barrier layer 28 is to be formed of CoWP, the substrate 21 is immersed in a CoWP electroless plating solution at the temperature of 80° C. to 90° C. for 10 seconds to 120 seconds. FIG. 10 is a view depicting a binarized micrograph of the surface of copper interconnection after the formation of barrier layer.

Next, the insulating film 29 is formed of a phenol resin with a thickness of, for example, 5 μm on the entire upper face of the substrate 21 (see FIG. 2J). Note that water cleaning of one minute is performed between each of the acid activation process step, the protection film formation step, the protection film removable step, and the barrier layer formation step.

Figure 11A:
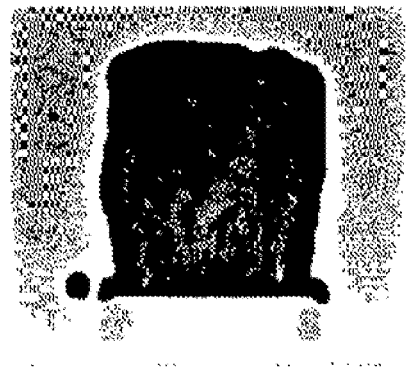
FIG. 11A is a view depicting a binarized cross-section micrograph of a sample of Example 1 which uses NiP as the barrier layer.
Figure 11B:
FIG. 11B is a view depicting a binarized cross-section micrograph of a sample of Example 1 which uses CoWP as the barrier layer.

The interconnection structure of Example 1 which has been formed as described above is subjected to the high-temperature accelerated test in which the interconnection structure is held for 24 hours in the atmosphere at the temperature of 200° C. Then, after the completion of the high-temperature accelerated test, a cross section of the interconnection is observed with a microscope. FIG. 11A is a view depicting a binarized cross-section micrograph of a sample of Example 1 which uses NiP as the barrier layer 28. FIG. 11B is a view depicting a binarized cross-section micrograph of a sample of Example 1 which uses CoWP as the barrier layer 28. It is found from FIGS. 11A and 11B that almost no voids occur in the boundary between the copper interconnection and the barrier layer.

COMPARATIVE EXAMPLE

A copper interconnection structure is formed as a comparative example in a way similar to Example 1 except that the barrier layer 28 is formed directly on the surface of the copper interconnections 26 without forming the protection film 27.

Figure 12A:
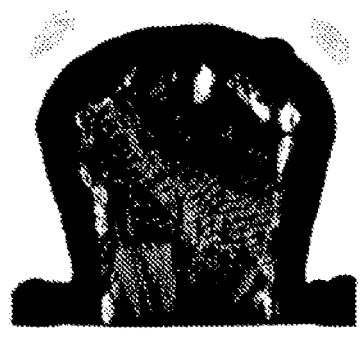
FIG. 12A is a view depicting a binarized cross-section micrograph of a sample of a comparative example which uses NiP as the barrier layer.
Figure 12B:
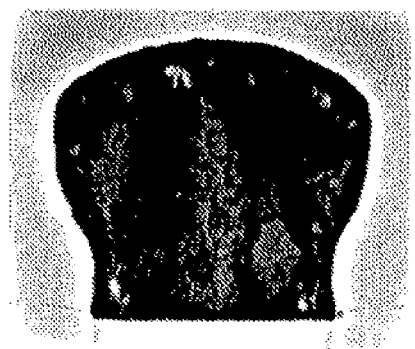
FIG. 12B is a view depicting a binarized cross-section micrograph of a sample of the comparative example which uses CoWP as the barrier layer.

The interconnection structure of the comparative example is subjected to the high-temperature accelerated test as in Example 1. Then, after the high-temperature accelerated test was finished, a cross section of the interconnection is observed with a microscope. FIG. 12A is a view depicting a binarized cross-section micrograph of a sample of the comparative example which uses NiP as the barrier layer 28. FIG. 12B is a view depicting a binarized cross-section micrograph of a sample of the comparative example which uses CoWP as the barrier layer 28. As depicted in FIGS. 12A and 12B, many voids occur in the boundary between the copper interconnection and the barrier layer in the comparative example.

EXAMPLE 2

A copper interconnection structure is formed as Example 2 in a way similar to Example 1 except that the formation process of Cu—N—R bonds and the cleaning process of surfaces of the copper interconnections 26 are performed simultaneously. A BTA aqueous solution whose concentration is 0.5 wt % to 1.0 wt % and whose pH is adjusted to be within a range of 8.0 to 10.0 by using KOH is used for the formation of Cu—N—R bonds and the cleaning of surfaces of the copper interconnections 26. The temperature of the BTA aqueous solution is set at the room temperature and the process time is 300 seconds.

Figure 13:
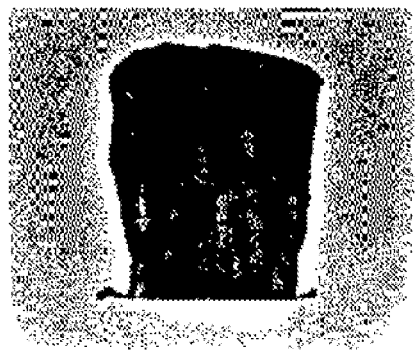
FIG. 13 is a view depicting a binarized cross-section micrograph of a sample of Example 2 which uses CoWP as the barrier layer.

The interconnection structure of Example 2 is subjected to the high-temperature accelerated test as in Example 1. Then, after the high-temperature accelerated test is finished, the cross section of the interconnection was observed with a microscope. FIG. 13 is a view depicting a binarized cross-section micrograph of a sample of Example 2 which uses CoWP as the barrier layer 28. In Example 2, although slightly more voids are occurring in the boundary between the copper interconnection and the barrier layer than in Example 1 (FIGS. 11A and 11B), the occurrences of voids are less compared to the comparative example (FIGS. 12A and 12B).

The usefulness of the technique disclosed in the present application is confirmed from the comparison between Examples 1, 2 and the comparative example.

2. Second Embodiment

FIGS. 14A to 14J are cross-sectional views depicting a method of forming an interconnection structure according to a second embodiment in the order of steps. In the embodiment, descriptions are given of a method of forming a multi-layer interconnection structure. Moreover, in FIGS. 14A to 14J, the same objects as those in FIGS. 2A to 2J are denoted with the same reference numerals.

Figure 14A:
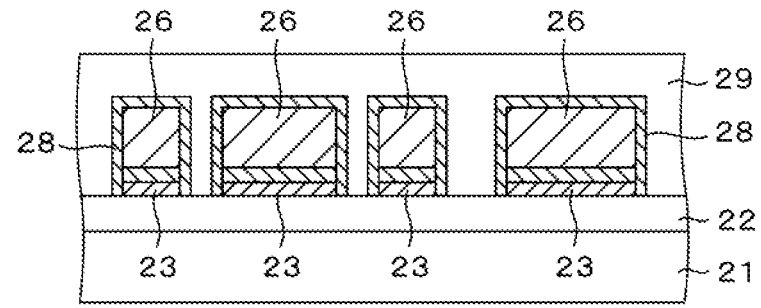
FIGS. 14A to 14J are cross-sectional views depicting a method of forming an interconnection structure according to a second embodiment.
Figure 14B:
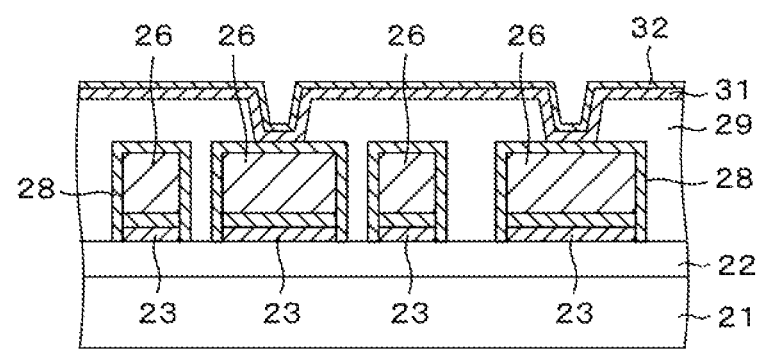

First, as depicted in FIG. 14A, a first interconnection layer (copper interconnections 26, an insulating film 29, and the like) are formed on a substrate 21 by the method described in the first embodiment. Next, as depicted in FIG. 14B, holes reaching the predetermined ones of the copper interconnections 26 from the surface of the insulating film 29 is formed and then an adhesion layer 31 made of a metal such as Ti and a plating seed layer 32 made of copper are sequentially formed on an entire upper face of the substrate 21.

Figure 14C:
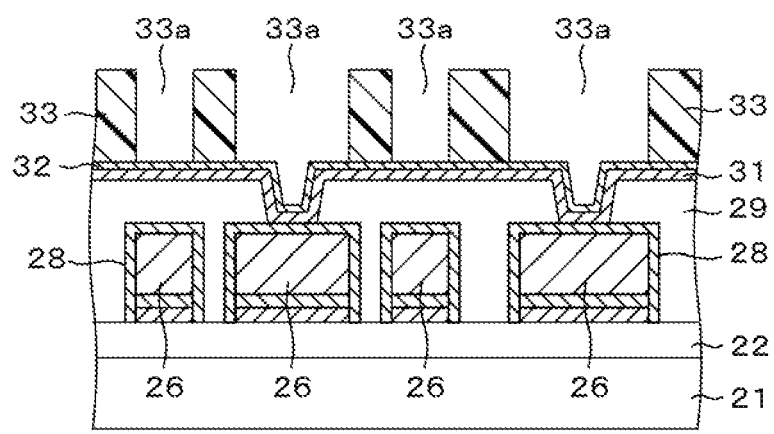

Next, as depicted in FIG. 14C, a photoresist film 33 is formed on the plating seed layer 32, the photoresist film 33 is subjected to exposure and development processes, and opening portions 33a through which the plating seed layer 32 is exposed are thereby formed with a desired pattern.

Figure 14D:
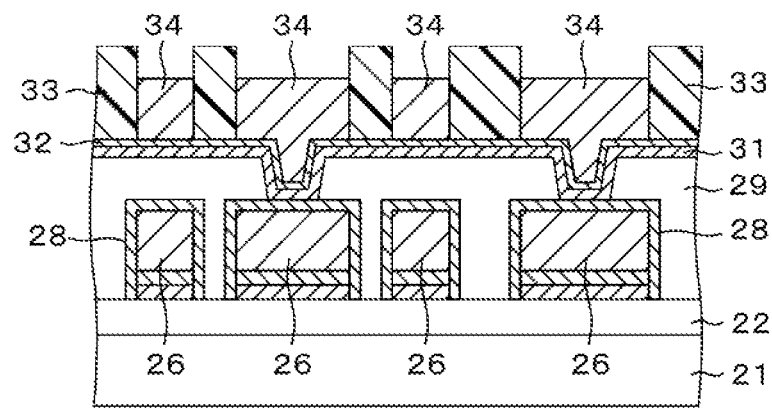
Figure 14E:
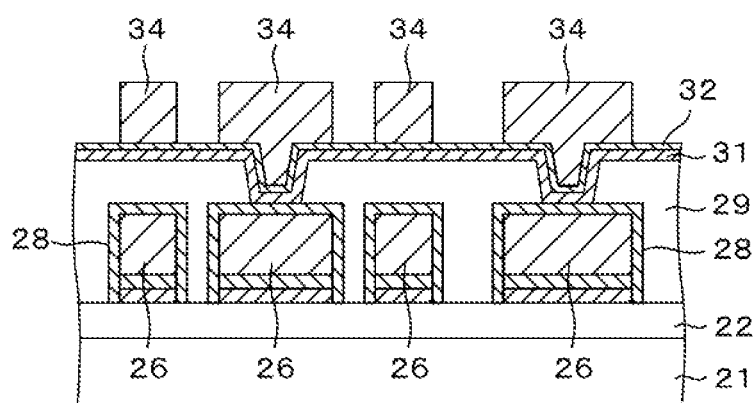
Figure 14F:
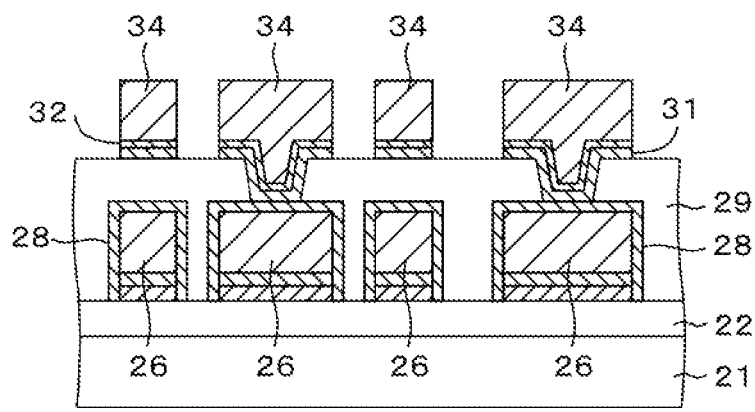

Next, as depicted in FIG. 14D, copper is plated with a thickness of, for example, 2 μm on the plating seed layer 32 inside the opening portions 33a and copper interconnections 34 are thereby formed. Thereafter, as depicted in FIG. 14E, the photoresist film 33 is removed. Then, as depicted in FIG. 14F, portions of the plating seed layer 32 and the adhesion layer 31 which are not covered with the copper interconnections 34 are removed by etching.

Figure 14G:
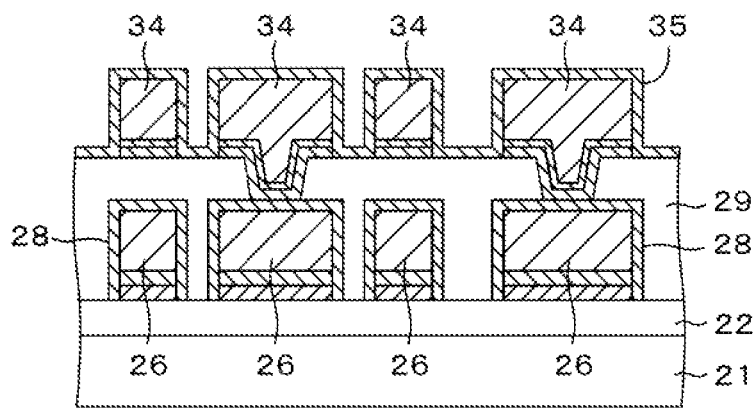

Next, the surfaces of the copper interconnections 34 are acid-cleaned and activated. Thereafter, the substrate 21 having the copper interconnections 34 formed thereon is immersed in a BTA aqueous solution to form a protection film 35 covering side faces and upper faces of the copper interconnections 34 as depicted in FIG. 14G. The protection film 35 includes BTA bonding with Cu (Cu—N—R) in grain boundary portions in the surfaces of the copper interconnections 34.

Figure 14H:
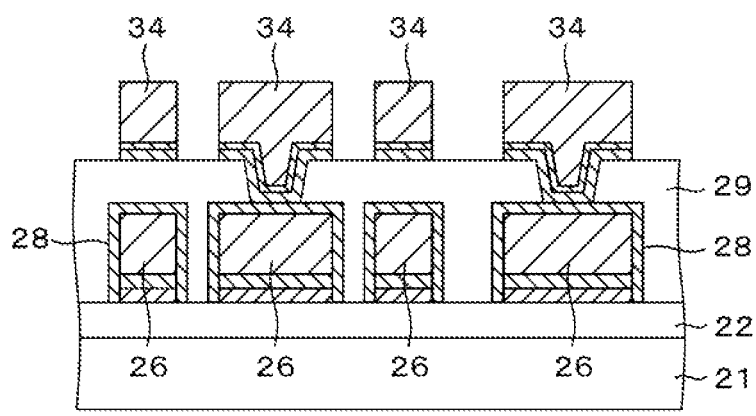

Next, the substrate 21 having the protection film 35 formed thereon is cleaned by using an alkaline aqueous solution whose pH is adjusted to be within a range of 8.0 to 10.0 and the protection film 35 is thereby removed as depicted in FIG. 14H. BTA bonding with Cu remains in the grain boundary portions in the surfaces of the copper interconnections 34 even after the protection film 35 is removed.

Figure 14I:
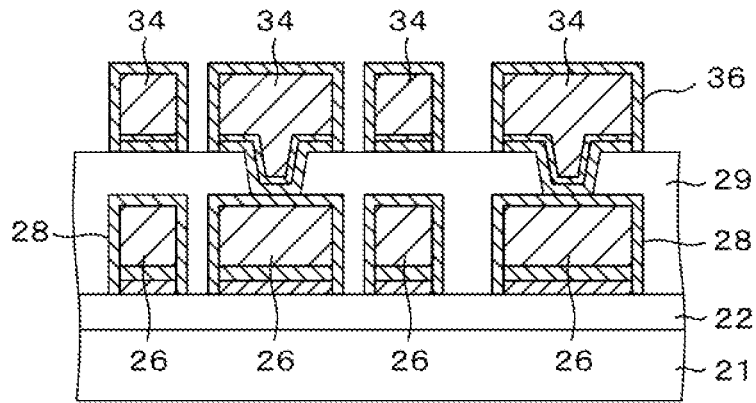

Next, the substrate 21 is immersed in an activation process solution and the surfaces of the copper interconnections 34 are activated. Thereafter, a barrier layer 36 covering the side faces and upper faces of the copper interconnections 34 is formed as depicted in FIG. 14I by an electroless plating method or the like.

Figure 14J:
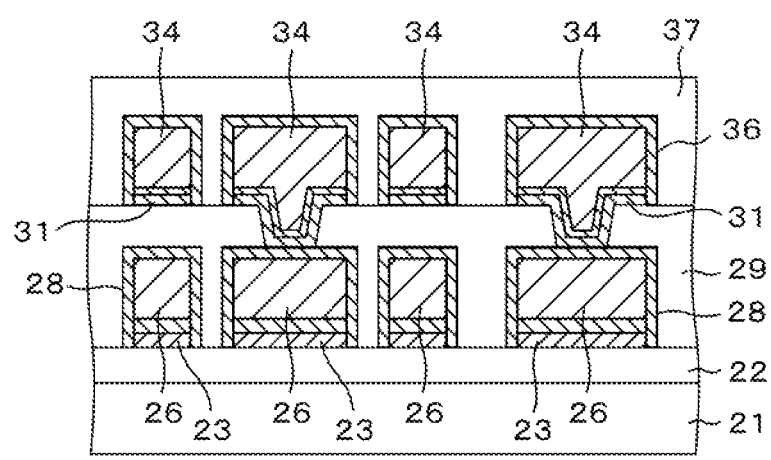

Next, as depicted in FIG. 14J, an insulating film 37 is formed on the entire upper face of the substrate 21 to cover the copper interconnections 34 with the insulating film 37. The second interconnection layer is thus completed. Thereafter, a third interconnection layer, a fourth interconnection layer, . . . are formed in a way similar to the second interconnection layer, if necessary. The interconnection structure (multi-layer interconnection structure) according to the embodiment is completed as describe above.

In the embodiment, BTA bonding with Cu (Cu—N—R) is provided in the grain boundary portions in the side faces and upper faces of the copper interconnections 26, 34. Hence, voids are less likely to occur in the copper interconnections 26, 34 and the electromigration resistance is thus high. Moreover, peripheries of the copper interconnections 26, 34 are covered with the adhesion layers 23, 31 and the barrier layers 28, 36. Thus, diffusion of metal atoms (Cu) into the insulating films 22, 29, 37 from the copper interconnections 26, 34 is prevented.

Furthermore, in the embodiment, oxidation of the copper interconnections 26, 34 caused by moisture and oxygen contained in the insulating film 22, 29, 37 is prevented by the adhesion layers 23, 31 and the barrier layers 28, 36. Accordingly, a disconnection or a current leakage, and an increase in electrical resistance are avoided in the interconnection structure according to the embodiment even when the interconnection structure is used for a long period, and the interconnection structure has a high reliability.

3. Third Embodiment

FIGS. 15A to 15F are cross-sectional views depicting a method of forming an interconnection structure according to a third embodiment in the order of steps. The embodiment describes an example where the technique disclosed above is applied to an interconnection structure of LSI.

Figure 15A:
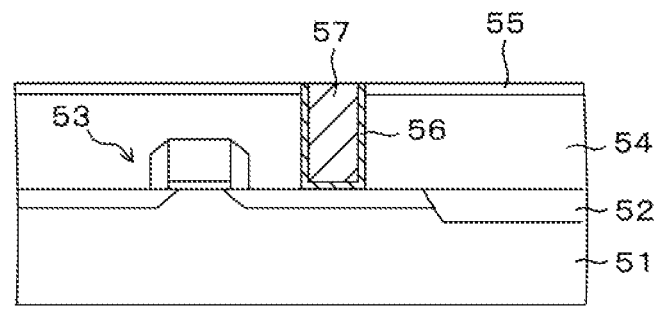
FIGS. 15A to 15F are cross-sectional views depicting a method of forming an interconnection structure according to a third embodiment.

First, steps to obtain a structure depicted in FIG. 15A are described. An element isolation film 52 and a transistor 53 are first formed on a semiconductor (silicon) substrate 51 by a publicly-known method. Thereafter, an interlayer insulating film 54 covering the element isolation film 52 and the transistor 53 is formed, and a protection film 55 is formed on the interlayer insulating film 54. Here, the interlayer insulating film 54 is made of silicon oxide and has a thickness of 300 nm. Moreover, the protection film 55 is made of SiOC and has a thickness of 50 nm.

Next, a photolithography method and an etching method which are publicly known are used to form a via hole reaching the transistor 53 from an upper face of the protection film 55. Then, a barrier layer 56 made of TiN is formed with a thickness of 25 nm on an entire upper face of the substrate 51 by, for example, a sputtering method and an inner side of the via hole is thereby covered with the barrier layer 56. Thereafter, a W (tungsten) film is formed on the entire upper face of the substrate 51 by a CVD method or the like and the inside of the via hole is filled with W to form a W plug 57. Next, the W film and the barrier layer 56 on the protection film 55 are removed by, for example, a CMP (Chemical Mechanical Polishing) method until the protection film 55 is exposed. Thus, the structure depicted in FIG. 15A is obtained.

Figure 15B:
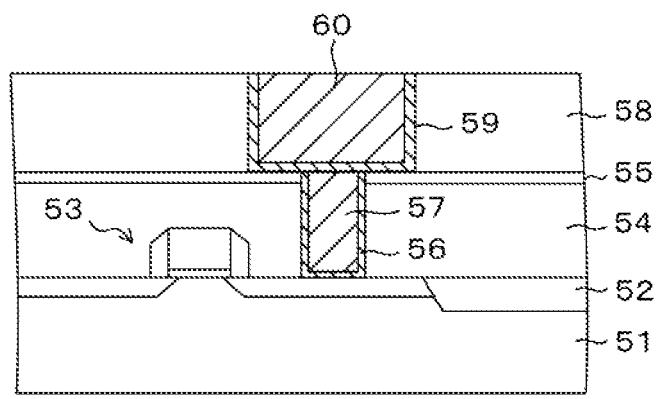

Next, steps to obtain a structure depicted in FIG. 15B are described. After the W plug 57 is formed in the step described above, an interlayer insulating film 58 is formed of silicon oxide or the like with a thickness of, for example, 300 nm on the protection film 55 and the W plug 57. Then, an interconnection trench is formed with a desired pattern in the interlayer insulating film 58 by using a photolithography method and an etching method. Thereafter, a barrier layer 59 is formed of, for example, Ta with a thickness of, for example, 5 nm to 20 nm on the entire upper face of the substrate 51. Then, a plating seed layer (not illustrated) made of Cu is formed with a thickness of 50 nm to 200 nm on the barrier layer 59. Subsequently, a copper film is formed on the plating seed layer by an electroplating method and the inside of the interconnection trench is also filled with copper to form a copper interconnection 60. Next, the copper film, the plating seed layer, and the barrier layer 59 on the interlayer insulating film 58 are removed by the CMP method until the interlayer insulating film 58 is exposed.

Figure 15C:
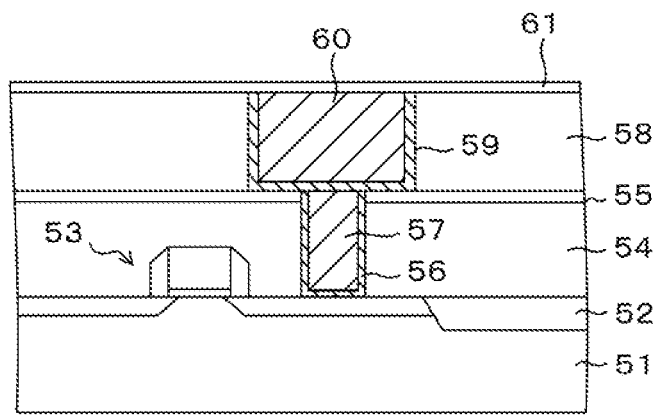
Figure 15D:
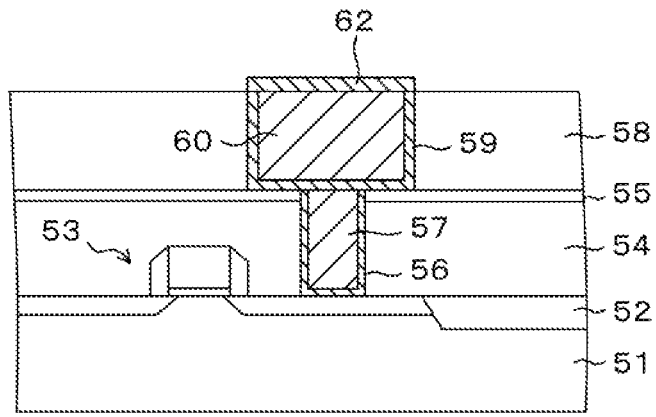

Next, steps to obtain structures respectively depicted in FIGS. 15C and 15D are described. After the copper interconnection 60 is formed in the step described above, an upper face of the copper interconnection 60 is subjected to an acid activation process by using, for example, a $H_2SO_4$ aqueous solution with a concentration of 10 wt % as described in the first embodiment. Thereafter, the substrate 51 is immersed in a BTA aqueous solution and a protection film (BTA film) 61 is thereby formed on the copper interconnection 60 as depicted in FIG. 15C. The protection film 61 has Cu—N—R bonds in grain boundary portions in an upper face of the copper interconnection 61.

Then, as depicted in FIG. 15D, the surface of the copper interconnection 60 is alkaline-cleaned by using a KOH aqueous solution or the like, and the protection film 61 is thereby removed. The Cu—N—R bonds remain in the grain boundary portions of the copper interconnection 60 even when the protection film 61 is removed. Thereafter, the substrate 51 is immersed in an activation process solution containing Pd and the surface of the copper interconnection 60 is thereby activated. Then, NiP or CoWP is electroless-plated on the copper interconnection 60 and the barrier layer (metal cap layer) 62 is thereby formed.

Figure 15E:
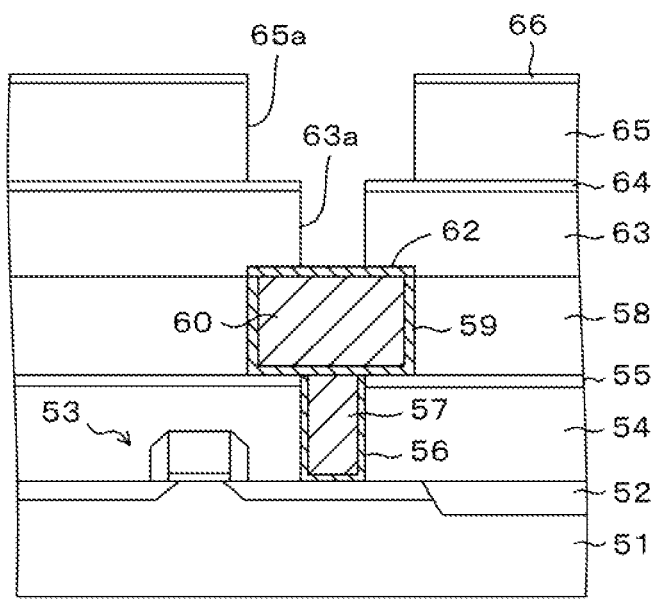

Next, steps to obtain a structure depicted in FIG. 15E are described. After the barrier layer 62 is formed in the step described above, an interlayer insulating film 63, a stopper film 64, an interlayer insulating film 65, and a stopper film 66 are sequentially formed on the entire upper face of the substrate 51. Here, it is assumed that the interlayer insulating films 63, 65 are made of silicon oxide and the stopper films 64, 66 are made of silicon nitride.

Thereafter, an interconnection trench 65a having a depth reaching the stopper film 64 from an upper face of the stopper film 66 and a via hole 63a reaching the copper interconnection 60 (barrier layer 62) from an upper face of the stopper film 64 are formed by using the photolithography method and the etching method.

Figure 15F:
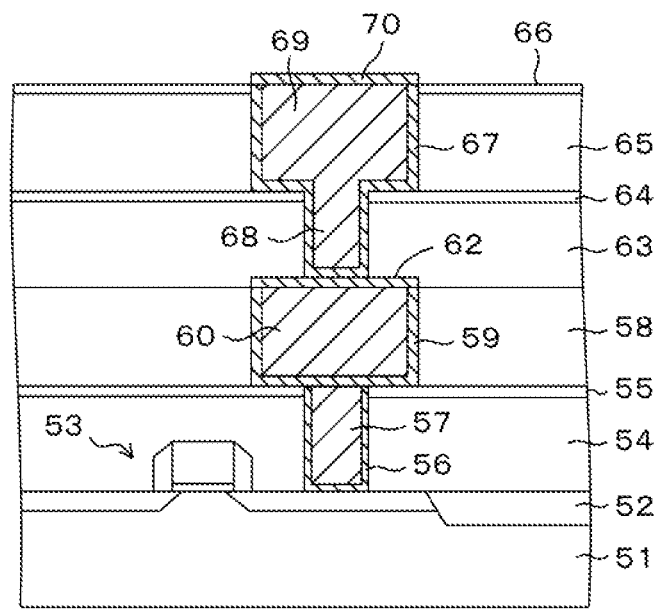

Next, steps to form a structure depicted in FIG. 15F are described. After the interconnection trench 65a and the via hole 63a are formed in the step described above, a barrier layer 67 made of, for example, NiP or CoWP and a plating seed layer (not illustrated) made of copper are formed sequentially on the entire upper face of the substrate 51. Thereafter, a copper film is formed on the plating seed layer by the electroplating method and the insides of the via hole 63a and the interconnection trench 65a are also filled with copper. Thus, a second copper interconnection 69 and a via contact 68 electrically connecting the second copper interconnection 69 and the first copper interconnection 60 are formed. Next, the copper film, the plating seed layer, and the barrier layer 67 on the stopper layer 66 are removed by the CMP method until the stopper layer 66 is exposed.

Next, as similar to the first copper interconnection 60, an upper face of the second copper interconnection 69 is subjected to an acid activation process by using, for example, a $H_2SO_4$ aqueous solution with a concentration of 10 wt %. Thereafter, the substrate 51 is immersed in a BTA aqueous solution and a protection film (not illustrated) is thereby formed on the second copper interconnection 69. The protection film includes Cu—N—R bonds in the grain boundary portions in the upper face of the second copper interconnection 69. Next, the surface of the second copper interconnection 69 is alkaline-cleaned by using a KOH aqueous solution or the like to remove the protection film. Thereafter, the substrate 51 is immersed in an activation process solution containing Pd and the surface of the second copper interconnection 69 is subjected to an activation process. Then, NiP or CoWP is electroless-plated on the second copper interconnection 69 and a barrier layer (metal cap layer) 70 is thereby formed. The multi-layer interconnection structure of a semiconductor device according to the embodiment is thus completed.

In the embodiment also, BTA bonding with Cu (Cu—N—R) is provided in the grain boundary portions in the upper face of the copper interconnections 60, 69. Hence, voids are less likely to occur in the copper interconnections 60, 69 and the electromigration resistance is thus high. Moreover, peripheries of the copper interconnections 60, 69 are covered with the barrier layers 59, 62, 67, 70. Thus, diffusion of metal atoms (Cu) into the insulating films 58, 63, 65 from the copper interconnections 60, 69 is prevented. Furthermore, oxidation of the copper interconnections 60, 69 caused by moisture and oxygen contained in the insulating films 58, 63, 65 is also prevented by the barrier layers 59, 62, 67, 70. Accordingly, a disconnection or a current leakage, and an increase in electrically resistance are avoided in the interconnection structure according to the embodiment even when the interconnection structure is used for a long period, and the interconnection structure has a high reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of forming an interconnection structure, the method comprising:
    forming a copper interconnection above a substrate;
    forming a Cu—N—R bond (provided that R is an organic group) in a grain boundary portion in a surface of the copper interconnection by bringing the copper interconnection into contact with an organic compound;
    cleaning the surface of the copper interconnection by using an alkaline cleaning solution;
    activating the surface of the copper interconnection by using an acid solution containing Pd after the cleaning the surface of the copper interconnection;
    forming a barrier layer by depositing a metal onto the surface of the copper interconnection after activating the surface of the copper interconnection; and
    forming an insulating film covering the copper interconnection and the barrier layer above the substrate.

2. The method of forming an interconnection structure according to claim 1, wherein the organic compound is any of imidazole-based organic compounds and organic compounds having a benzene ring and a N—H bond.

3. The method of forming an interconnection structure according to claim 1, wherein a pH of the cleaning solution is within a range of 8.0 to 10.0.

4. The method of forming an interconnection structure according to claim 1, wherein the barrier layer is formed by electroless plating.

5. The method of forming an interconnection structure according to claim 1, wherein the barrier layer contains one metal compound selected from a group consisting of CoWP, CoWB, CoP, CoB, NiP, NiWP, NiB, and NiWB, as a main component.

6. The method of forming an interconnection structure according to claim 1, wherein the forming a Cu—N—R bond and the cleaning the surface of the copper interconnection are performed simultaneously by using a BTA (Benzo triazole) aqueous solution having a pH adjusted to be within a range of 8.0 to 10.0.

7. The method of forming an interconnection structure according to claim 1, wherein the copper interconnection is formed by a semi-additive method.

8. The method forming an interconnection structure according to claim 1, wherein,
    before the forming the copper interconnection, the method comprises:
        forming a underlying insulating film on the substrate; and
        forming an adhesion layer made of a metal on the underlying insulating film, and,
    between the forming a copper interconnection and the forming a Cu—N—R bond, the method comprises:
        removing a portion of the adhesion layer, the portion not covered with the copper interconnection.

9. The method of forming an interconnection structure according to claim 1, wherein the cleaning the surface of the copper interconnection is performed after the forming a Cu—N—R bond.

* * * * *